United States Patent
Suto

(10) Patent No.: US 11,868,577 B2
(45) Date of Patent: Jan. 9, 2024

(54) INPUT CHECK DEVICE HAVING A PRESSING FORCE THRESHOLD BASED ON A DETECTED MINIMUM PRESSING FORCE AND INPUT CHECK METHOD

(71) Applicant: ALPS ALPINE CO., LTD., Tokyo (JP)

(72) Inventor: Shunichi Suto, Fukushima (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 17/657,980

(22) Filed: Apr. 5, 2022

(65) Prior Publication Data
US 2022/0334681 A1    Oct. 20, 2022

(30) Foreign Application Priority Data
Apr. 14, 2021   (JP) ................. 2021-068345

(51) Int. Cl.
*G06F 3/044* (2006.01)
*G06F 3/041* (2006.01)
*H03K 17/975* (2006.01)

(52) U.S. Cl.
CPC .......... *G06F 3/0447* (2019.05); *G06F 3/0445* (2019.05); *G06F 3/04146* (2019.05); *H03K 17/975* (2013.01); *H03K 2217/9651* (2013.01)

(58) Field of Classification Search
None
See application file for complete search history.

(56) References Cited

U.S. PATENT DOCUMENTS

| 2013/0147734 A1* | 6/2013 | Yasumoto | G06F 3/045 345/173 |
| 2013/0229380 A1* | 9/2013 | Lutz, III | G06F 1/1684 345/173 |

(Continued)

FOREIGN PATENT DOCUMENTS

| CN | 105677090 A | * | 6/2016 |
| CN | 110266876 A | * | 9/2019 |

(Continued)

OTHER PUBLICATIONS

Extended European Search Report for 22165132.6 dated Sep. 8, 2022.

*Primary Examiner* — Kirk W Hermann
(74) *Attorney, Agent, or Firm* — IPUSA, PLLC

(57) ABSTRACT

An input check device includes a coordinate detection part configured to detect coordinates of a touch operation a user performs on an operating surface when operating an operating part through the operating surface; a pressing force detection part configured to detect a pressing force of the touch operation; and an identifying part configured to determine whether the operating part is ON or OFF based on the pressing force detected in the pressing force detection part, and, after determining that the operating part is switched from ON mode to OFF mode, the identifying part detects a minimum value of the pressing force; and the identifying part determines that the operating part is switched from OFF to ON when, following the detection of the minimum value, the pressing force surpasses a predetermined threshold that is set based on the minimum value and that is greater than the minimum value.

6 Claims, 3 Drawing Sheets

(56) References Cited

U.S. PATENT DOCUMENTS

| | | | |
|---|---|---|---|
| 2013/0265273 A1* | 10/2013 | Marsden | G06F 3/0416 345/174 |
| 2015/0084874 A1* | 3/2015 | Cheng | G06F 3/04883 345/173 |
| 2016/0370909 A1* | 12/2016 | Wang | G06F 3/0416 |
| 2017/0285870 A1* | 10/2017 | Wang | G06F 3/0418 |
| 2018/0314365 A1* | 11/2018 | Kihara | G06F 3/044 |
| 2020/0264727 A1* | 8/2020 | Lee | G06F 3/0416 |
| 2021/0064157 A1* | 3/2021 | Matsubara | G06F 3/041 |

FOREIGN PATENT DOCUMENTS

| | | | |
|---|---|---|---|
| KR | 20100018883 A | * | 2/2010 |
| WO | 2017/122466 | | 7/2017 |

* cited by examiner

INPUT CHECK DEVICE HAVING A PRESSING FORCE THRESHOLD BASED ON A DETECTED MINIMUM PRESSING FORCE AND INPUT CHECK METHOD

CROSS-REFERENCE TO RELATED APPLICATIONS

This application is based on and claims priority to Japanese Patent Application No. 2021-068345, filed on Apr. 14, 2021, the entire contents of which are incorporated herein by reference.

BACKGROUND OF THE INVENTION

1. Field of the Invention

The disclosure herein relates to an input check device and an input check method.

2. Description of the Related Art

Conventionally, there is electrical equipment including an operating part that accepts inputs from the operator, a contact detection part that detects contacts on the operating part, a piezoelectric element that detects changes of pressure loads on the operating part, and a control part that executes a first process when the piezoelectric element detects a change with the first pressure load, and, in this electrical equipment, when the piezoelectric element detects a change with a second pressure load and the contact detection part keeps detecting contacts after the first pressure load is detected until the second pressure load is detected, the control part executes a second process. The amount of change with the second pressure load is less than or equal to the amount of change with the first pressure load. The input of the first pressure load is what is commonly referred to as a "half-press," and the input of the second pressure load is what is commonly referred to as a "full press" (see, for example, patent document 1).

RELATED-ART DOCUMENTS

Patent Documents

[Patent Document 1]: International Publication No. WO2017-122466A1

SUMMARY OF THE INVENTION

An input check device, according to at least one embodiment of the present disclosure, includes a coordinate detection part configured to detect coordinates of a touch operation a user performs on an operating surface when operating an operating part through the operating surface, a pressing force detection part configured to detect a pressing force of the touch operation, and an identifying part configured to determine whether the operating part is ON or OFF based on the pressing force detected in the pressing force detection part, and, in this input check device, after determining that the operating part is switched from ON mode to OFF mode, the identifying part detects a minimum value of the pressing force, and when, following the detection of the minimum value, the pressing force surpasses a predetermined threshold, the predetermined threshold being set based on the minimum value and being greater than the minimum value, the identifying part determines that the operating part is switched from OFF to ON.

DESCRIPTION OF THE PREFERRED EMBODIMENTS

According to the present disclosure, it is possible to provide an input check device having excellent operability, and an input check method.

Now, an embodiment for carrying out the input check device and input check method according to the present disclosure will be described below with reference to the accompanying drawings.

Embodiment

Figure 1:
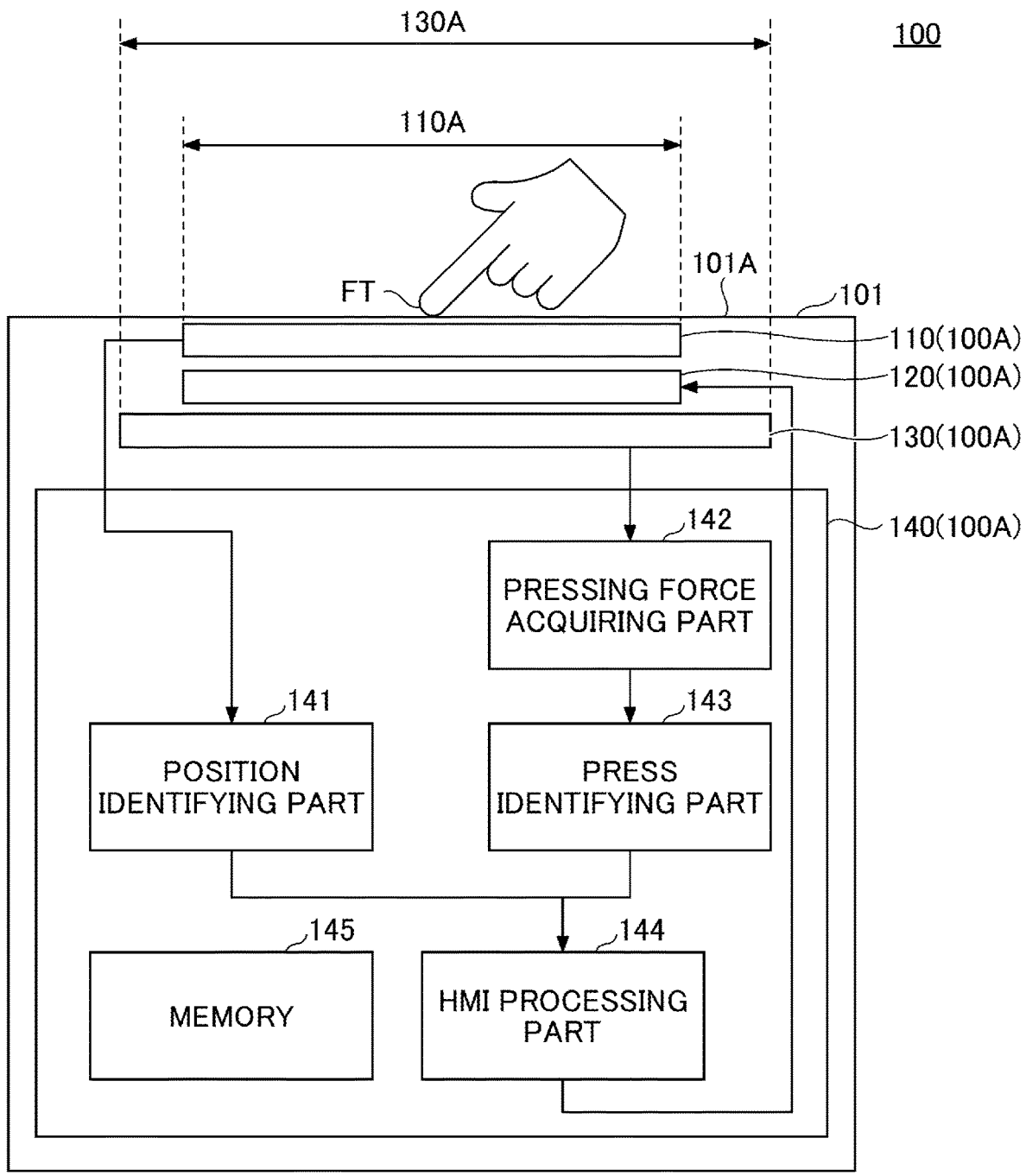
FIG. 1 is a diagram showing electrical equipment 100 according to an embodiment.

FIG. 1 is a diagram showing electrical equipment 100 according to the embodiment. The electrical equipment 100 includes a housing 101, a touch panel 110, a display panel 120, a pressing force detection part 130, and a control device 140. The touch panel 110 is an example of a coordinate detection part, and the display panel 120 is an example of a display part.

With the present embodiment, the portion of the electrical equipment 100 excluding the housing 101 constitutes the input check device 100A. Therefore, the touch panel 110, the display panel 120, the pressing force detection part 130, and the control device 140, which are included in the input check device 100A, are marked with the reference sign of the input check device 100A in parentheses. Furthermore, the method executed on the input check device 100A is the input check method according to the embodiment. Note that the input check device 100A may include the housing 101.

In the following description, the XYZ coordinate system will be defined and described, in which the direction parallel to the X axis (X direction), the direction parallel to the Y axis (Y direction), and the direction parallel to the Z axis (Z direction) are orthogonal to each other. Also, in the following description, the −Z direction side may be referred to with words such as "the lower side," "below," and so forth, and the +Z direction side may be referred to with words such as "the upper side," "above," and so forth, but this is only for ease of explanation, and does not refer to the general concept of up and down. Also, a plan view means a view in the X-Y plane. Furthermore, in the following description, each component may be shown in exaggerated length, thickness, breadth, and so forth, for ease of understanding of the configuration.

The housing 101 includes an operating surface 101A, and accommodates the touch panel 110, the display panel 120, the pressing force detection part 130, and the control device 140. The housing 101 is made of resin, for example. The operating surface 101A is the surface of a transparent plate located above the touch panel 110. The transparent plate is made of glass or resin, for example.

In FIG. 1, the thickness of the housing 101 in the Z direction is exaggerated. The operating surface 101A is parallel to the XY plane. In this one example, the touch panel 110, the display panel 120, and the pressing force detection part 130 are provided in this order from the operating surface 101A downward. Note that the order in which the touch panel 110, the display panel 120, and the pressing force detection part 130 are provided is not limited to this.

For example, the electrical equipment 100 detects, in the touch panel 110, the coordinates of a touch operation the user performs on the operating surface 101A, detects the pressing force of the touch operation in the pressing force detection part 130, accepts a touch operation on an operating part, which the control device 140 shows on the display panel 120 in a GUI (Graphic User Interface), based on the coordinates detected on the touch panel 110 and the pressing force detected in the pressing force detection part 130, and controls the display on the display panel 120 based on the content of the operation. The operating part, according to the present embodiment, may be an image of an operating icon, an image of an operation menu, an image of an operation switch, and so forth shown on the display panel 120. A touch operation is an input operation the user performs by touching the operating surface 101A with his/her fingertip FT, and is an input operation whereby the user operates the operating part via the operating surface 101A. Furthermore, the control device 140 may control the display on the display panel 120 based on the content of operation, and, furthermore, output control signals for controlling the electrical equipment 100 as the control target that serves as the user's input part.

The electrical equipment 100 is equipment that can be mounted on a vehicle, for example, and that can be used as an HMI (Human Machine Interface). In this case, the equipment to be the target of control may be, for example, a variety of equipment such as the navigation system, the audio system, and the air conditioner that are mounted on the vehicle. The control signals output from the control device 140 are, for example, signals for operating these equipments.

In this example, the touch panel 110 is a capacitive touch panel and detects the coordinates to show the position of the fingertip FT of the user's hand or the like, touching on the operating surface 101A. Here, a case will be described as an example where the user touches the operating surface 101A with his/her fingertip FT to input operations. Note that the touch panel 110 may be of a type other than the capacitive type, and may be, for example, a resistive-film type.

For the display panel 120, for example, a liquid crystal display panel, an organic EL (Electroluminescence) display panel, and so forth can be used. The display panel 120 can show images of operating parts of various equipment in the vehicle described above. For example, when audio equipment is the target of control, GUI images to represent the volume-control switch, the tune-selection switch, and so forth may serve as images of operating parts.

The pressing force detection part 130 detects the pressing force of a touch operation performed on the operating surface 101A. The pressing force is the downward pressure load of the touch operation. For the pressing force detection part 130, for example, a sensor using a piezo element, a sensor capable of detecting displacement, and so forth can be used. Note that the pressing force detection part 130 may be a processing part that converts the area of the touch operation detected on the touch panel 110 into a pressing force. The pressing force detection part 130 is larger than the touch panel 110 in a plan view. A region 130A, in which the pressing force can be detected, is larger than a region 110A, in which the touch operation on the touch panel 110 can be detected in a plan view, and includes the region 110A. By this means, even when a touch operation is performed in an edge part of the touch panel 110, the pressing force can still be detected. The relationship in size between the pressing force detection part 130 and the region 130A and the touch panel 100 and the region 110A is an example, and is by no means limiting.

The control device 140 includes a position identifying part 141, a pressing force acquiring part 142, a press identifying part 143, an HMI processing part 144, and a memory 145. The press identifying part 143 is an example of an identifying part. The control device 140 is implemented using a computer including a CPU (Central Processing part), a RAM (Random Access Memory), a ROM (Read Only Memory), an HDD (Hard Disk Drive), an input/output interface, an internal bus, and so forth.

The position identifying part 141, the pressing force acquiring part 142, the press identifying part 143, and the HMI processing part 144 are program functions that are executed on the control device 140, and shown as functional blocks. The memory 145 represents, functionally, the memory of the control device 140.

The position identifying part 141 applies a voltage to a number of electrodes that extend in the X direction of the touch panel 110 and a number of electrodes that extend in the Y direction, in order, detects the capacitance at the intersections of the electrodes extending in the X direction and the electrodes extending in the Y direction, and identifies the position (coordinates) where the touch operation was performed.

The pressing force acquiring part 142 acquires the pressing force detected in the pressing force detection part 130, applies digital conversion processing and the like to it, and outputs the resulting data to the press identifying part 143.

The press identifying part 143 compares the data representing the pressing force, output from the pressing force acquiring part 142, against a threshold, and determines whether or not the operating part is turned ON or OFF by the press of the touch operation. With the present embodiment, the state in which an operating part is touch-operated (pressed) with a pressing force greater than or equal to a threshold will be rephrased as "the operating part is (turned) ON." Meanwhile, the state in which the operating part is touch-operated (pressed) with a pressing force less than the threshold, or the state in which the touch operation is cancelled, will be rephrased as "the operating part is (turned) OFF." The process in the press identifying part 143 will be described later with reference to FIG. 2.

The HMI processing part 144 controls the display on the display panel 120 based on the position identified by the position identifying part 141 as where the touch operation was performed, and the result determined by the press identifying part 143. When the operating part is turned ON for the first time based on the result determined by the press identifying part 143, the HMI processing part 144 places the operating part in a state in which it is selected. Furthermore, when the operating part is turned ON for the second time, the press identifying part sets up a state in which the selection is confirmed.

The memory 145 stores the programs and data that the position identifying part 141, the pressing force acquiring part 142, the press identifying part 143, and the HMI processing part 144 need to perform processes, as well as data generated by these processes.

Figure 2:
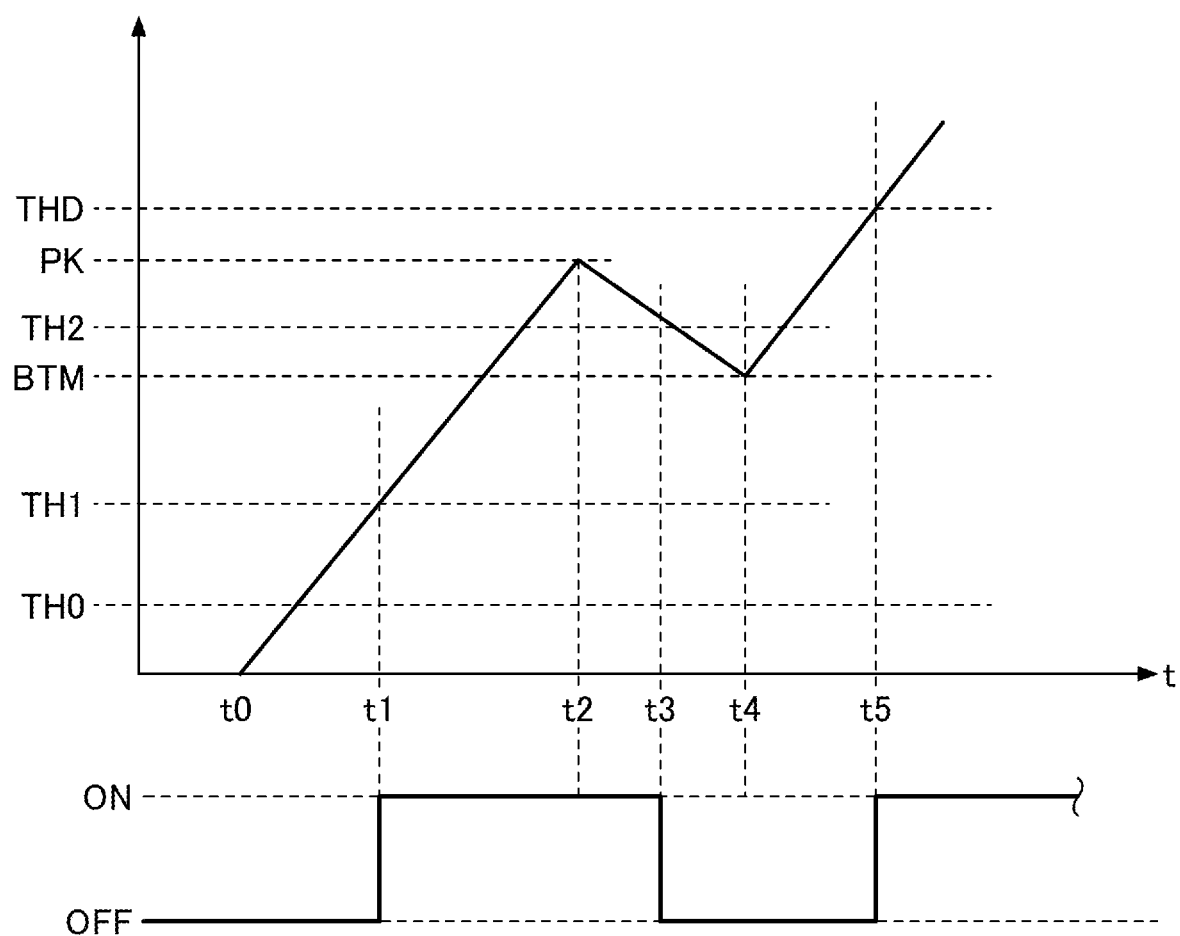
FIG. 2 is a diagram showing an example of the relationship between the pressing force of a touch operation performed on an operating surface 101A, and the thresholds a press identifying part 143 uses to determine whether an operating part is ON or OFF.

FIG. 2 is a diagram showing an example of the relationship between the pressing force of the touch operation performed on the operating surface 101A and the thresholds the press identifying part 143 uses to determine whether the operating part is ON or OFF. In FIG. 2, the horizontal axis is a time axis t. Below the horizontal axis, the results (ON and OFF) determined by the press identifying part 143 are shown. Furthermore, the vertical axis of FIG. 2 shows a first threshold TH1, a second threshold TH2, and a predetermined threshold THD, and shows, in addition, a threshold TH0, a peak value PK, and a bottom value BTM.

The first threshold TH1 is the threshold for use when switching the operating part from OFF mode to ON mode. If the pressing force surpasses the first threshold TH1 while the operating part is OFF, the press identifying part 143 determines that the operating part is turned ON. This is when the operating part is turned ON for the first time by the touch operation. The first threshold TH1 is used, for example, when the user presses the operating surface 101A and performs the touch operation for selecting an operating part. When the press identifying part 143 determines that the pressing force surpasses the first threshold TH1 and an operating part is turned ON, the operating part is selected. Note that, even when the operating part is turned ON for the first time and then turned OFF later, the HMI processing part 144 keeps the state in which the operating part is selected, as long as the pressing force is greater than the first threshold TH1.

The peak value PK is the peak value of pressing force to be detected by the press identifying part 143 after the operating part switches from OFF mode to ON mode. After the operating part switches from OFF mode to ON mode, the press identifying part 143 monitors the pressing force and detects the peak value (maximum value) of the pressing force. The press identifying part 143 stores the detected peak value PK in the memory 145.

Assuming that the pressing force drops from the peak value PK while the operating part is ON, the second threshold TH2 is the threshold for use to determine whether the operating part is switched from ON to OFF. The second threshold TH2 is set to a predetermined proportion of the peak value PK (proportion expressed as a percentage smaller than 100%) by the press identifying part 143. The predetermined proportion is set to 70% to 85%, for example. When the pressing force drops from the peak value PK and equals or falls below the second threshold TH2 while the operating part is ON, the press identifying part 143 determines that the operating part is switched from ON to OFF.

When the pressing force drops from the peak value PK and equals or falls below the second threshold TH2 while the operating part is ON and the operating part switches from ON to OFF, the bottom value BTM is the minimum value of the pressing force at that time. The bottom value BTM is detected within a predetermined period of time after the pressing force equals or falls below the second threshold TH2. The limitation "within a predetermined period of time" is provided because, after an operating part is selected and gives the first ON, the second ON to confirm the operating part's selection is likely to come at an early stage after the first ON. Assuming the state in which the user softens his/her pressing force while still selecting (touching on) an operating part, the bottom value BTM of the pressing force is the minimum value produced before the user presses on the operating part again to confirm the selection of this operating part. The bottom value BTM is a value less than or equal to the second threshold TH2 and greater than the first threshold TH1. This is because the selection of the operating part is cancelled OFF by the HMI processing part 144 if the pressing force equals or falls below the first threshold TH1. The bottom value BTM is detected by the press identifying part 143 and stored in the memory 145.

The predetermined threshold THD is the threshold for use when the pressing force drops from the peak value PK and equals or falls below the second threshold TH2 while the operating part is ON, the operating part switches from ON to OFF, the pressing force increases again after reaching the bottom value BTM, and then the operating part switches from OFF to ON again. This is when the operating part is turned ON for the second time by the touch operation after the first ON. The predetermined threshold THD is a value set by the press identifying part 143 based on the bottom value BTM, and is, for example, the value adding a predetermined proportion of the bottom value BTM to the bottom value BTM, or the value adding a threshold (an example of a third threshold) to the bottom value BTM. The predetermined proportion may be set to, for example, approximately 40% to 60%. The threshold to add to the bottom value BTM may be set to, for example, approximately 40% to 60% of the bottom value BTM, or a real value may be provided in advance and used.

The threshold TH0 is the threshold for use to determine whether or not a touch operation is performed on the operating surface 101A. Here, whether or not a touch operation is performed is determined by the press identifying part 143, for example. Note that the threshold TH0 may be, for example, about half of the first threshold TH1.

As shown in FIG. 2, when the pressing force rises at a time t0 and surpasses the first threshold TH1 at a time t1, the press identifying part 143 determines that the operating part is switched from OFF to ON. While the pressing force keeps increasing, the press identifying part 143 keeps monitoring the pressing force and detects the peak value PK at a time t2. Upon detecting the peak value PK, the press identifying part 143 calculates the second threshold TH2.

When the pressing force drops after time t2 and equals or falls below the second threshold TH2 at a time t3, the press identifying part 143 determines that the operating part is switched from ON to OFF. The pressing force keeps dropping, and the press identifying part 143 keeps monitoring the pressing force and detects the bottom value BTM at a time t4. Upon detecting the bottom value BTM, the press identifying part 143 calculates a predetermined threshold THD.

The pressing force increases again after reaching the bottom value BTM, and, when the pressing force surpasses the predetermined threshold THD at a time t5, the press identifying part 143 determines that the operating part is switched from OFF to ON. After the operating part is turned ON at time t1 and turned OFF at time t3, the pressing force surpasses the predetermined threshold THD, which is set by the press identifying part 143 based on the bottom value BTM, without equaling or falling below the first threshold TH1, and therefore the press identifying part 143 determines that the operating part is switched from OFF to ON. This is the second on. The operating part is turned ON again while still being selected, so that the operation of selecting this operating part is confirmed.

Figure 3:
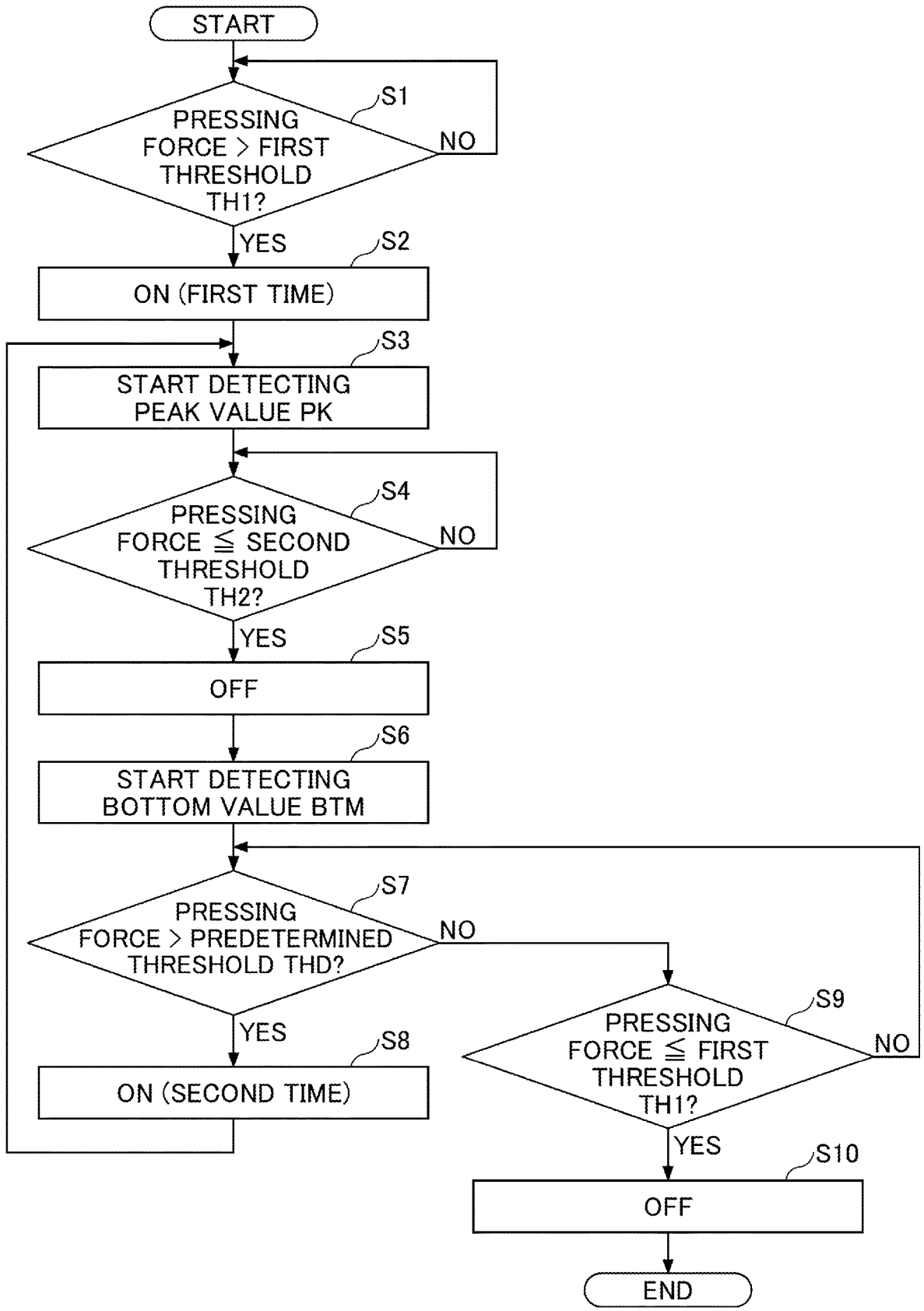
FIG. 3 is a diagram showing a flowchart of the process executed in the press identifying part 143.

FIG. 3 is a diagram showing a flowchart of the process executed in the press identifying part 143. The process shown in the flowchart of FIG. 3 is the process in the input check method of the embodiment.

When the process starts, the press identifying part 143 determines whether or not the pressing force is greater than the first threshold TH1 (step S1). When the press identifying part 143 determines that the pressing force does not surpass the first threshold TH1 (S1: NO), the process of step S1 is repeated until the pressing force is determined to be greater than the first threshold TH1 (S1: YES).

When determining that the pressing force is greater than the first threshold TH1 (S1: YES), the press identifying part 143 determines that the operating part is switched from OFF to ON (step S2). This is the first ON. Upon the first ON, the HMI processing part 144 places the operating part in a state in which it is selected.

The press identifying part 143 starts the detection of the peak value PK of the pressing force (step S3). Step S3 is a subroutine process, in which, after the operating part switches from OFF mode to ON mode, the press identifying part 143 monitors the pressing force, thereby detecting the peak value (maximum value) of the pressing force. Note that the press identifying part 143 stores the detected peak value PK in the memory 145.

Upon detecting the pressing force peak value PK, the press identifying part 143 determines whether or not the pressing force is less than or equal to the second threshold TH2 (step S4). The press identifying part 143 repeats the process of step S4 until the pressing force equals or falls below the second threshold TH2.

When the press identifying part 143 determines that the pressing force is less than or equal to the second threshold TH2 (S4: YES), the press identifying part 143 determines that the operating part is switched from ON to OFF (step S5). When doing this, the HMI processing part 144 keeps the operating part in the state in which it is selected.

The press identifying part 143 starts the detection of the bottom value BTM (step S6). Step S6 is a subroutine process, in which the press identifying part 143 monitors the pressing force, thereby detecting the peak value of the pressing force.

The press identifying part 143 determines whether or not the pressing force is greater than the predetermined threshold THD (step S7).

When the press identifying part 143 determines in step S7 that the pressing force is greater than the predetermined threshold THD (S7: YES), the press identifying part 143 determines that the operating part is turned ON (step S8). Since this is the second ON, the HMI processing part 144 confirms the selection of the operating part. When the process of step S8 is finished, the press identifying part 143 returns to step S3 of the flow to check the operations after the second ON.

Also, when the press identifying part 143 determines that the pressing force does not surpass the predetermined threshold THD (S7: NO), the press identifying part 143 determines whether or not the pressing force is less than or equal to the first threshold TH1 (step S9). This process of determining whether or not the pressing force is less than or equal to the first threshold TH1 is provided because there are cases where the pressing force is less than or equal to the predetermined threshold THD and the operation for the second ON is not performed.

When the press identifying part 143 determines that the pressing force is less than or equal to the first threshold TH1 (S9: YES), the press identifying part 143 determines that the operating part is turned OFF (step S10). As a result of this, the HMI processing part 144 places the operating part in a state in which it is not selected. The above done, the series of processes is finished (end).

Furthermore, when the press identifying part 143 determines in step S9 that the pressing force is not less than or equal to the first threshold TH1 (S9: NO), the press identifying part 143 returns to step S7 of the flow, to determine whether the pressing force is greater than the predetermined threshold THD.

As described above, with the electrical equipment 100 and the input check device 100A, an operating part is turned ON for the first time when the pressing force surpasses the first threshold TH1, the operating part switches from ON to OFF when the pressing force drops from the peak value PK and equals or falls below the second threshold TH2 while the operating part is ON, and the operating part is turned ON for the second time when the pressing force reaches the bottom value BTM and surpasses the predetermined threshold THD. In this way, the second ON can be identified at an early stage.

Therefore, it is possible to provide an input check device 100A and electrical equipment 100 having excellent operability, as well as an input check method. As a result of this, the HMI processing part 144 can confirm the selection of the operating part at an early stage based on the result of ON/OFF check in the press identifying part 143 and the position identified by the position identifying part 141 as where the touch operation is performed.

Furthermore, the press identifying part 143 determines that the operating part is turned ON when the pressing force surpasses the first threshold TH1 while the operating part is OFF, determines that the operating part is switched from ON to OFF when the pressing force surpasses the first threshold TH1 and then equals or falls below the second threshold TH2, and, after thus determining that the operating part is switched from ON to OFF, detects the bottom value BTM of the pressing force, so that, when the pressing force drops after the first ON and starts rising towards the second ON, the press identifying part 143 can detect the bottom value then as the bottom value BTM.

Furthermore, since the bottom value BTM is a value that is less than or equal to the second threshold TH2 and that is greater than the first threshold TH1, it is possible to identify the second ON at an earlier stage.

Furthermore, when the pressing force surpasses the first threshold TH1 and equals or falls below the second threshold TH2, the pressing force's bottom value BTM is detected before the pressing force equals or falls below the first threshold TH1, and the pressing force surpasses a predetermined threshold THD, the press check part 143 determines that the operating part is switched from OFF to ON, so that, when, following the first ON, the operation for the second ON is performed successively, it is possible to identify the second ON.

Furthermore, the predetermined threshold THD is the value adding a predetermined proportion to the bottom value BTM, or the value adding a threshold to the bottom value BTM, so that the predetermined threshold THD for identifying the second ON can be generated based on the bottom value BTM detected, and the second ON can be executed, at an early stage, depending on the pressing force. Consequently, it is possible to provide an input check device 100A and electrical equipment 100 having even better operability, as well as an input check method.

Although an embodiment of the input check device and input check according to the present disclosure have been described above by way of an example, the specific embodiment of the disclosure herein is by no means limiting, and various modifications and changes can be made without departing from the scope of the herein-contained claims.

What is claimed is:

1. An input check method for an input check device, the input check device comprising:
a coordinate detection part configured to detect coordinates of a touch operation a user performs on an operating surface when operating an operating part through the operating surface;
a pressing force detection part configured to detect a pressing force of the touch operation; and
an identifying part configured to determine whether the operating part is ON or OFF based on the pressing force detected in the pressing force detection part, said identifying part being configured to determine that the operating part is selected upon determining that the operating part is in a first ON mode, and determine that a selection of the operating part is confirmed upon determining that the operating part is in a second ON mode, the input check method comprising steps of:
after determining that the operating part is switched from the first ON mode to a second OFF mode while the pressing force decreasing, detecting a local minimum value of the pressing force at which the pressing force resumes to increase; and
determining that the operating part is switched from the second OFF mode to the second ON mode when, following the detection of the local minimum value, the pressing force surpasses a predetermined threshold that is set based on the local minimum value and that is greater than the local minimum value, and determining that the operating part is placed in a state in which the operating part is not selected, following the detection of the local minimum value, upon determining that the pressing force is less than or equal to a first threshold, wherein:
when the pressing force surpasses a first threshold while the operating part is in a first OFF mode, the identifying part determines that the operating part is turned to the first ON mode;
when the pressing force surpasses the first threshold and becomes equal to or less than a second threshold, the second threshold being higher than the first threshold and being a predetermined proportion of a peak value of the pressing force, the identifying part determines that the operating part is switched from the first ON mode to the second OFF mode; and
within a predetermined time after determining that the operating part is switched from the first ON mode to the second OFF mode, the identifying part detects the local minimum value of the pressing force.

2. An input check device comprising:
a coordinate detection part configured to detect coordinates of a touch operation a user performs on an operating surface when operating an operating part through the operating surface;
a pressing force detection part configured to detect a pressing force of the touch operation; and
an identifying part configured to determine whether the operating part is ON or OFF based on the pressing force detected in the pressing force detection part, said identifying part being configured to determine that the operating part is selected upon determining that the operating part is in a first ON mode, and determine that a selection of the operating part is confirmed upon determining that the operating part is in a second ON mode, wherein:
after determining that the operating part is switched from the first ON mode to a second OFF mode while the pressing force decreasing, the identifying part detects a local minimum value of the pressing force at which the pressing force resumes to increase; and
the identifying part determines that the operating part is switched from the second OFF mode to the second ON mode when, following the detection of the local minimum value, the pressing force surpasses a predetermined threshold that is set based on the local minimum value and that is greater than the local minimum value, and determines that the operating part is placed in a state in which the operating part is not selected, following the detection of the local minimum value, upon determining that the pressing force is less than or equal to a first threshold, wherein:
when the pressing force surpasses the first threshold while the operating part is in a first OFF mode, the identifying part determines that the operating part is turned to the first ON mode;
when the pressing force surpasses the first threshold and becomes equal to or less than a second threshold, the second threshold being higher than the first threshold and being a predetermined proportion of a peak value of the pressing force, the identifying part determines that the operating part is switched from the first ON mode to the second OFF mode; and
within a predetermined time after determining that the operating part is switched from the first ON mode to the second OFF mode, the identifying part detects the local minimum value of the pressing force.

3. The input check device according to claim 2, wherein the local minimum value is a value that is less than or equal to the second threshold, and that is greater than the first threshold.

4. The input check device according to claim 2, wherein, when the pressing force surpasses the predetermined threshold while the pressing force surpasses the first threshold and becomes equal to or less than the second threshold and the local minimum value of the pressing force is detected without the pressing force becoming equal to or less than the first threshold, the identifying part determines that the operating part is switched from the second OFF mode to the second ON mode.

5. The input check device according to claim 2, wherein the predetermined threshold is a value adding a predetermined proportion of the local minimum value to the local minimum value, or a value adding a third threshold to the local minimum value.

6. The input check device according to claim 5, wherein the predetermined proportion is 40% to 60%.

* * * * *